United States Patent
Cleitus et al.

(10) Patent No.: US 7,643,954 B2
(45) Date of Patent: Jan. 5, 2010

(54) BIDIRECTIONAL COMMUNICATION SYSTEM AND CALIBRATOR

(75) Inventors: Antony Cleitus, Cork (IE); Hiroo Matsue, Yokohama (JP); Tomonao Kikuchi, Fujisawa (JP); Shigeru Tokita, Yokohama (JP)

(73) Assignee: Opnext Japan, Inc., Yokohama-shi (JP)

( * ) Notice: Subject to any disclaimer, the term of this patent is extended or adjusted under 35 U.S.C. 154(b) by 175 days.

(21) Appl. No.: 11/755,217

(22) Filed: May 30, 2007

(65) Prior Publication Data
US 2007/0286319 A1 Dec. 13, 2007

(30) Foreign Application Priority Data
Jun. 8, 2006 (JP) ............................. 2006-159371

(51) Int. Cl.
*H04L 7/00* (2006.01)
*G06F 5/06* (2006.01)
*G06F 1/04* (2006.01)
*G01F 1/12* (2006.01)
*G06F 19/00* (2006.01)

(52) U.S. Cl. ............................. 702/89; 702/85; 702/187; 702/189; 713/375; 713/400; 713/500; 713/600

(58) Field of Classification Search ............................. 702/1, 702/57, 79, 85, 89, 90, 107, 108, 109, 117, 702/124, 125, 127, 176, 178, 187, 188, 189; 713/375, 400, 500, 501, 503, 600
See application file for complete search history.

(56) References Cited

U.S. PATENT DOCUMENTS

| | | | | |
|---|---|---|---|---|
| 3,534,337 A | * | 10/1970 | Martin et al. | 702/188 |
| 4,689,740 A | | 8/1987 | Moelands et al. | |
| 6,377,640 B2 | * | 4/2002 | Trans | 375/354 |
| 6,643,787 B1 | | 11/2003 | Zerbe et al. | |
| 6,950,956 B2 | * | 9/2005 | Zerbe et al. | 713/400 |
| 7,042,914 B2 | * | 5/2006 | Zerbe et al. | 370/516 |
| 7,535,933 B2 | * | 5/2009 | Zerbe et al. | 370/516 |
| 2001/0038674 A1 | * | 11/2001 | Trans | 375/355 |
| 2002/0181633 A1 | * | 12/2002 | Trans | 375/354 |
| 2004/0076192 A1 | * | 4/2004 | Zerbe et al. | 370/516 |
| 2004/0098634 A1 | * | 5/2004 | Zerbe et al. | 713/500 |
| 2006/0120409 A1 | * | 6/2006 | Zerbe et al. | 370/516 |

FOREIGN PATENT DOCUMENTS

JP 57-106262 7/1982

* cited by examiner

*Primary Examiner*—Edward R Cosimano
(74) *Attorney, Agent, or Firm*—Brundidge & Stanger, P.C.

(57) ABSTRACT

A master station includes a group of circuits for performing an optimization method. In such a system, the optimization is achieved by adjusting the pull-up resistance and by setting the best possible clock frequency to ensure that data/clock high and low voltage levels are within predetermined specifications. An optimization procedure is performed in a calibration phase invoked by a user or a system whenever a change is introduced to the system, such as addition or deletion of slave stations, a change of data/clock lines, or a change that may affect on the electrical and timing characteristics of the two-wire communication system.

2 Claims, 11 Drawing Sheets

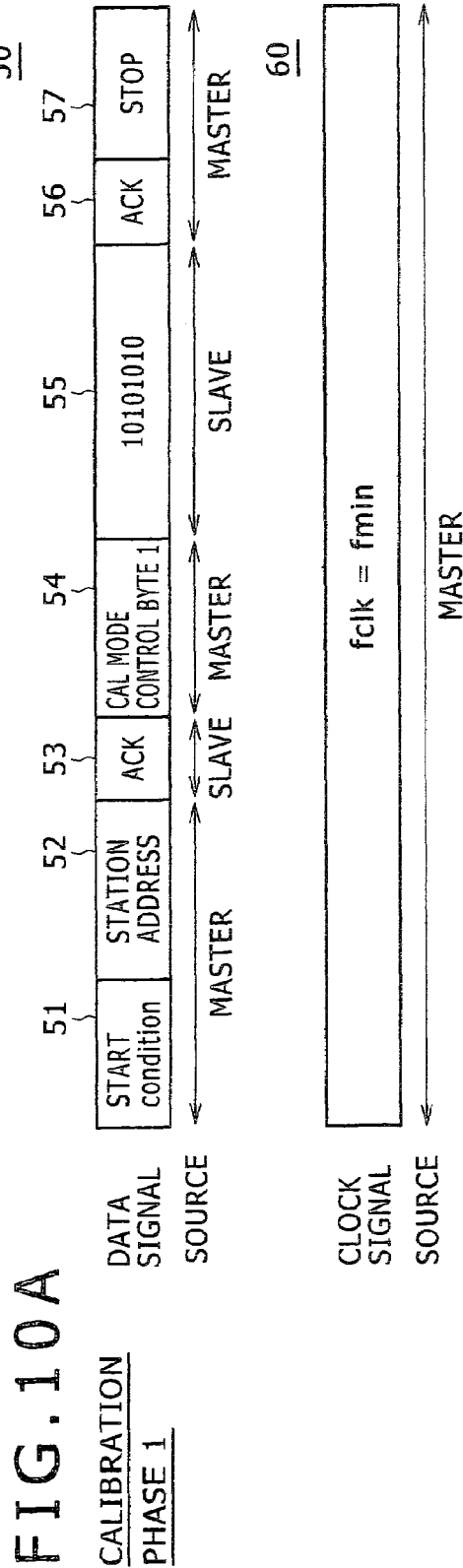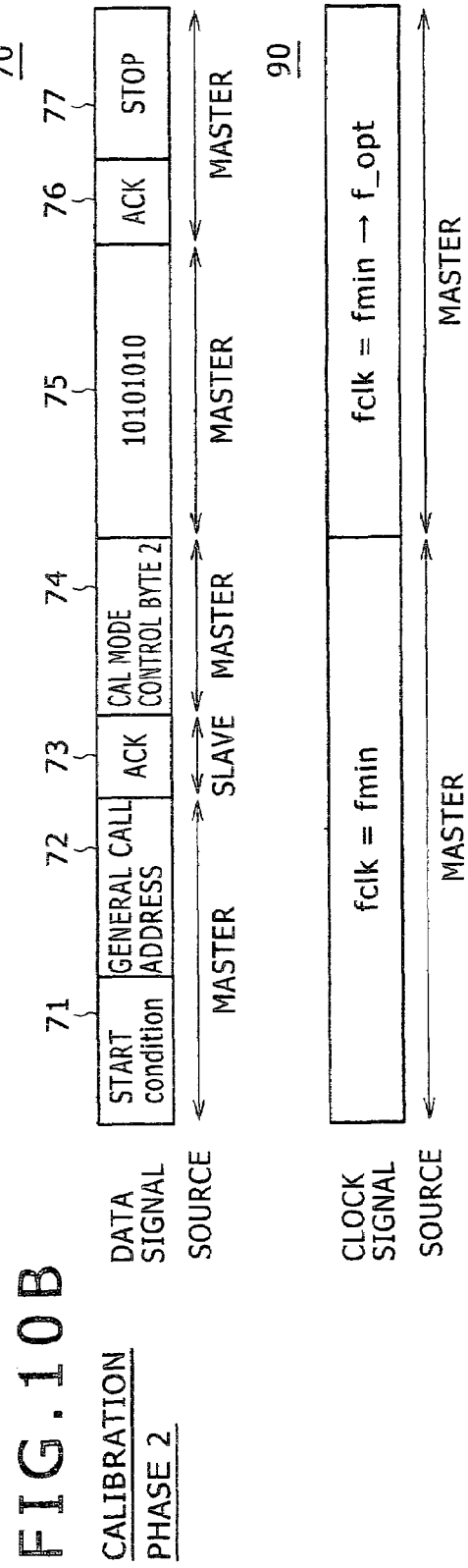

US 7,643,954 B2

BIDIRECTIONAL COMMUNICATION SYSTEM AND CALIBRATOR

CLAIM OF PRIORITY

The present application claims priority from Japanese patent application serial no. 2006-159371, filed on Jun. 8, 2006, the content of which is hereby incorporated by reference into this application.

BACKGROUND OF THE INVENTION

The present invention relates to a bidirectional communication system and a calibrator. More particularly, the invention relates to a two-wire bidirectional data communication system including a data line for transferring data signals and a clock line for transferring clock signals, in which plural stations having common pull-up resistances are provided, and to a calibrator.

The background of the invention will be described with reference to FIG. 1. Here FIG. 1 is a block diagram of a two-wire bidirectional data communication system. In FIG. 1, a data line 12 and a clock line 13 include a pull-up resistance 14-1 and a pull-up resistance 14-2 respectively to which a master station 11-1 and plural slave stations 11-2 to 11-N are connected.

The master station 11-1 includes a field-effect transistor (FET) 24-1 for generating data output and an amplifier 22-1 for performing data input in order to input and output data signals, each of which is connected to a data unit 23-1 for performing signal processing of transmitted data and received data. Also there are connected a field-effect transistor 27-1, an amplifier 25-1, and a clock unit 26-1 in the similar way for clock signals.

The slave stations 11-2 to 11-N have the same configuration as the master station.

In this system, the data line 12 of the master station 11-1 and slave stations 11-2 to 11-N is connected to the pull-up resistance 14-1. Also the clock line 13 thereof is connected to the pull-up resistance 14-2. Further, due to wiring, a parasitic capacitance 21-1 is generated between an earth potential and the data line 12, and a parasitic capacitance 21-2 is generated between an earth potential and the clock line 13.

The two-wire bidirectional data communication system is disclosed in U.S. Pat. No. 4,689,740. Incidentally JP-A No. 106262/1982 is the Japanese counterpart of U.S. Pat. No. 4,689,740.

In such a communication system having plural salve stations, the voltage levels of the data signal and clock signal as well as the timing characteristics, such as rise time and fall time, are dependent on the number of stations to be connected. For this reason, the connectable number of stations and the pull-up resistance value have been set in advance in consideration of the leakage current and the parasitic capacitance in each station.

Meanwhile in a system where the number of stations can be flexibly changed, the number of stations is changed in an application, so that the leakage current and the parasitic capacitance in each station are different from the design values. This has sometimes caused degradation of data signal waveform due to reduction of signal amplitude, increase of rise/fall time and the like.

There is described in U.S. Pat. No. 6,643,787 a method for suppressing communication errors caused by the signal degradation as described above. This technology includes a circuit called a data history generator in each slave station to optimize a bandwidth compensation circuit provided in a data receiving section so that each slave station suppresses the error rate of received data.

However, in the technology described in U.S. Pat. No. 6,643,787, complex circuits such as the data history generator and the bandwidth compensation circuit are necessary.

SUMMARY OF THE INVENTION

The present invention provides a two-wire bidirectional communication system and a calibrator that are able to flexibly support the change of the number of stations by optimizing the electrical and timing characteristics of a data signal and clock signal transmitted via a data line and clock line, respectively, between many stations without the need for complex circuits.

To solve the above described problem, the present invention introduces a calibrator for controlling variable pull-up resistances provided in a data line and in a clock line to control the clock signal frequency.

With respect to an arbitrary number of stations interconnected in the two-wire bidirectional communication system, the calibrator detects the signal levels of the data signal and clock signal by a peak detector and by a bottom detector, and performs optimization so that the pull-up resistance values of the data line and clock line are desired voltage levels. In addition, the calibrator adjusts the clock frequency to provide a maximum communication speed, while detecting that the signal levels of the data signal and clock signal are at the desired voltage levels.

As described above, the present invention achieves optimization of the voltage levels of the data signal and clock signal, the rise time, and the fall time in the two-wire bidirectional communication system. Such optimization can be performed in response to addition or deletion of a station, initialization of the system, or a user request.

BRIEF DESCRIPTION OF THE DRAWINGS

Preferred embodiments of the present invention will now be described in conjunction with the accompanying drawings, in which:

FIGS. 10A and 10B are sequence diagrams each illustrating the data signal and the clock signal during a calibration operation;

DESCRIPTION OF THE PREFERRED EMBODIMENTS

Figure 1:
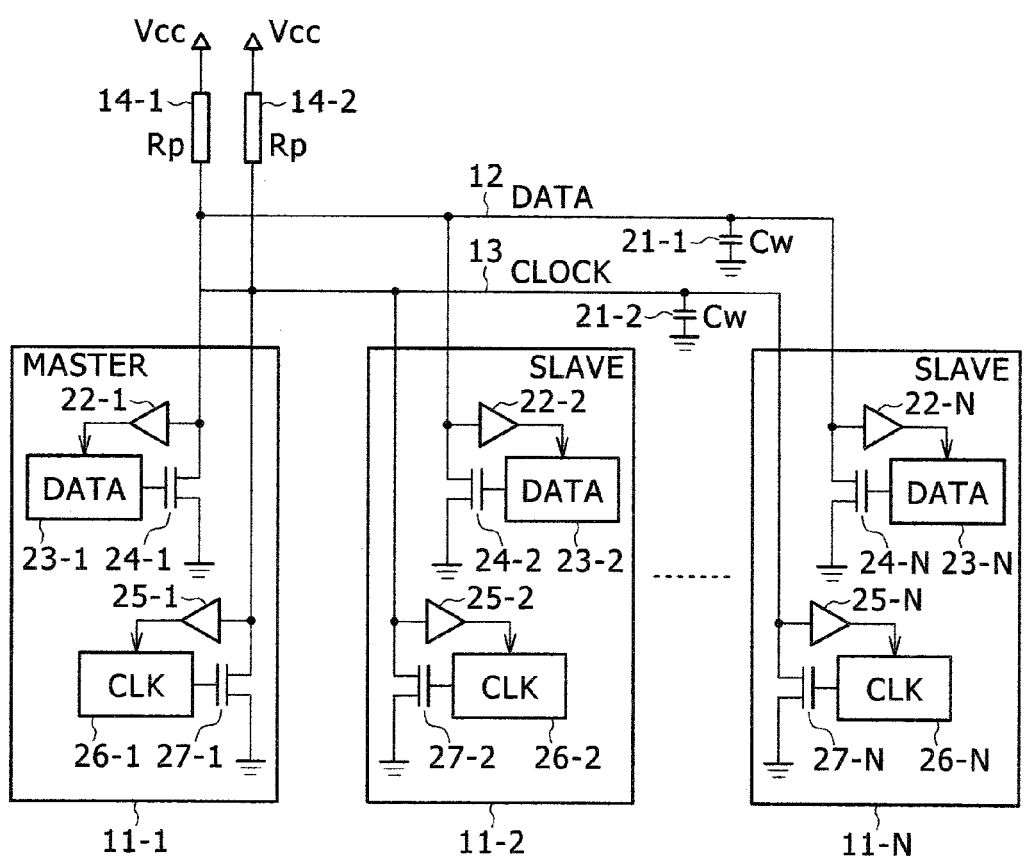
FIG. 1 is a block diagram of a two-wire bidirectional data communication system.
Figure 2:
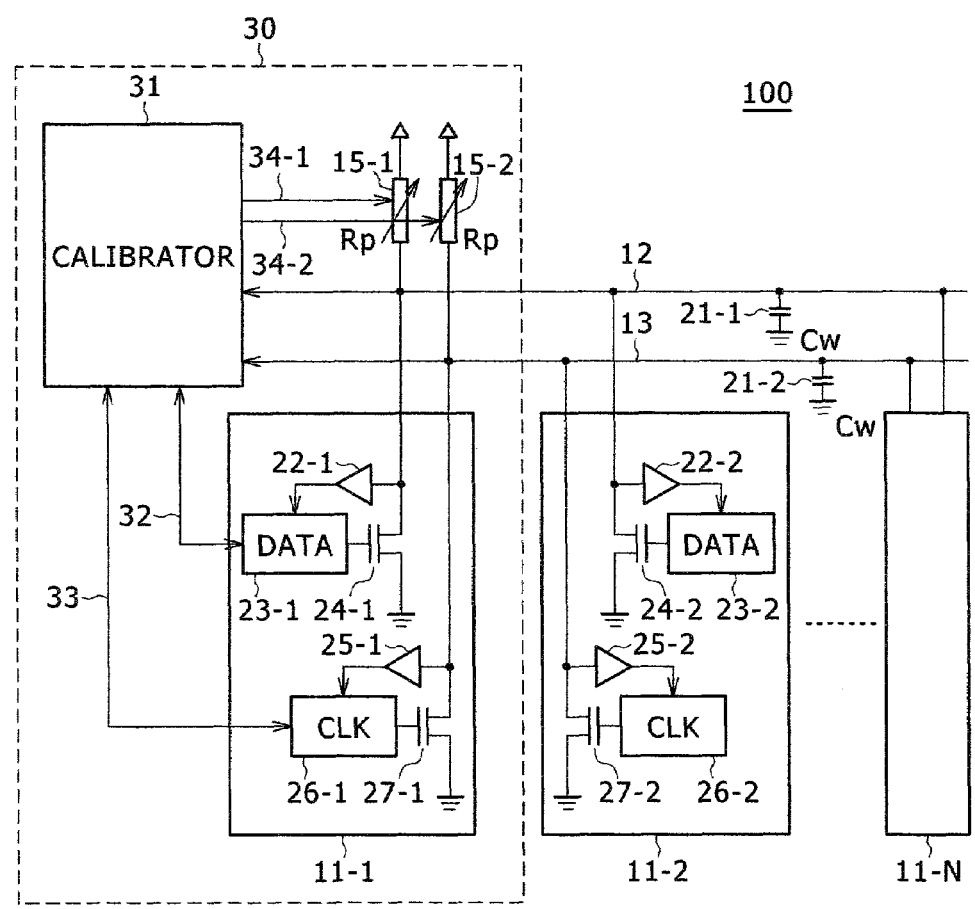
FIG. 2 is a block diagram of a two-wire bidirectional communication system.
Figure 3:
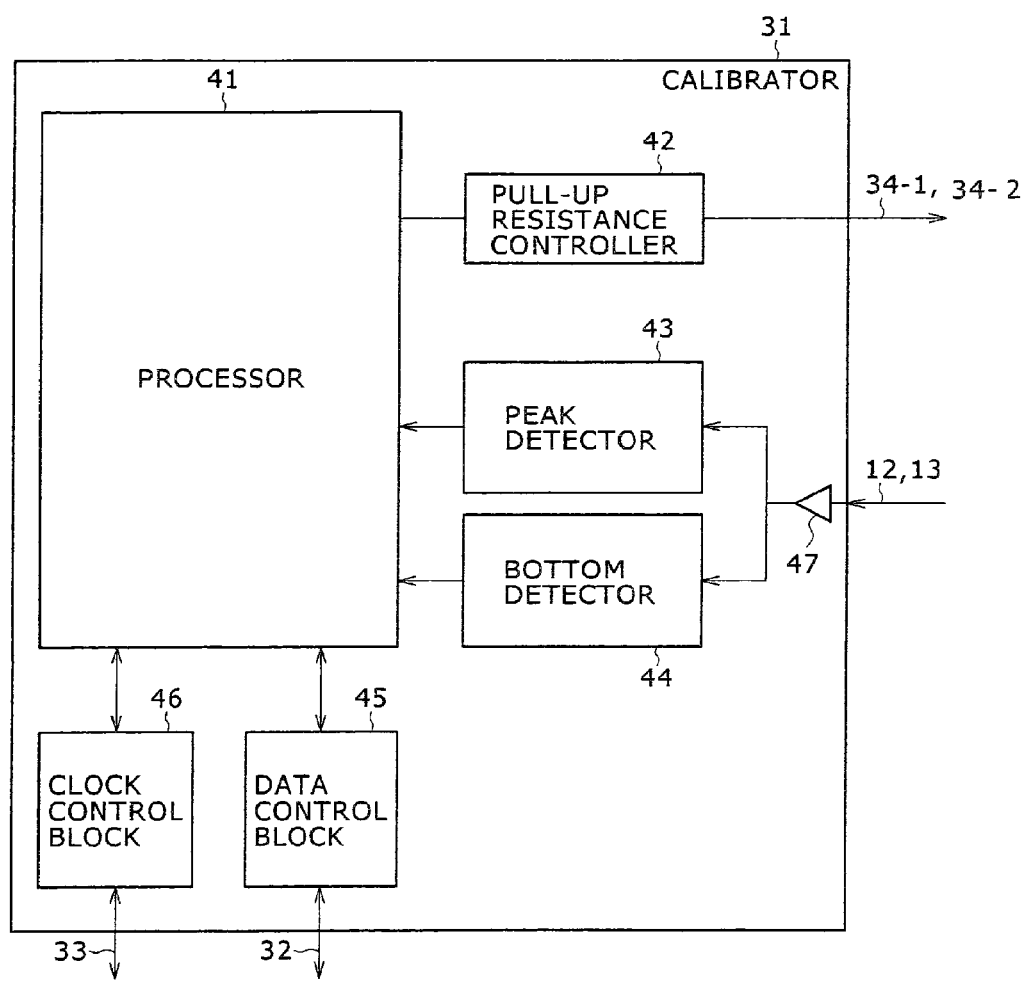
FIG. 3 is a block diagram of a calibrator.
Figure 4:
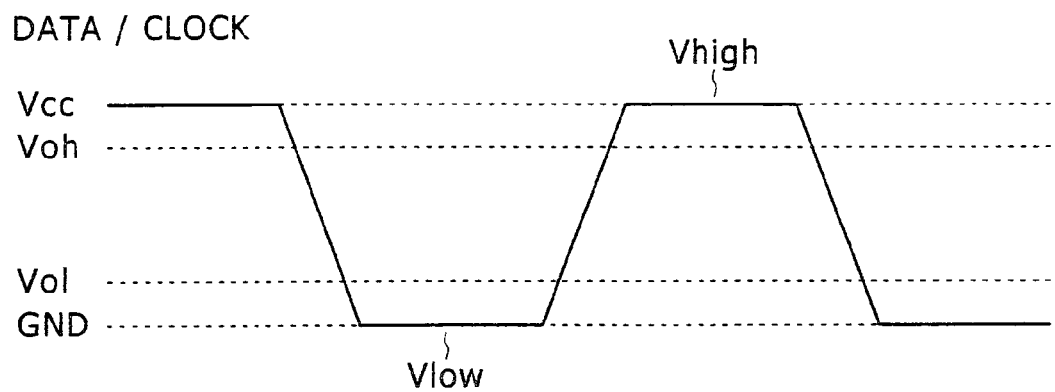
FIG. 4 is a diagram illustrating an ideal waveform of voltage amplitude of a data signal and clock signal for a two-wire communication system.
Figure 5:
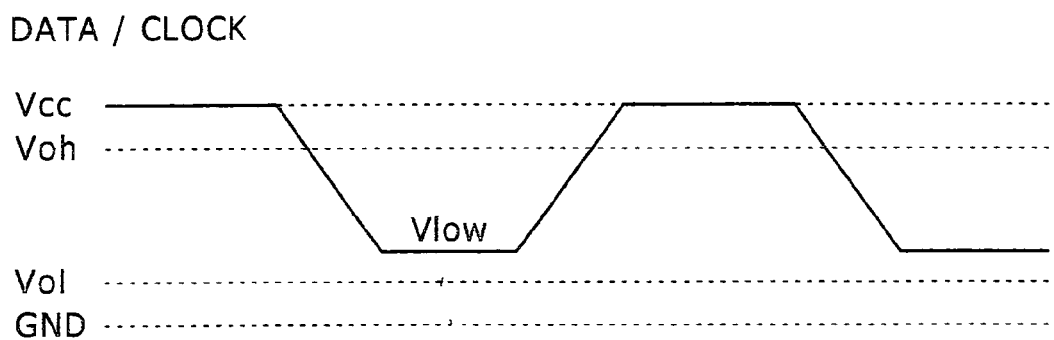
FIG. 5 is a diagram illustrating a waveform of voltage amplitude of the data signal and clock signal for the two-wire communication system.
Figure 6:
FIG. 6 is a diagram illustrating a waveform of voltage amplitude of the data signal and clock signal for the two-wire communication system.
Figure 7A:
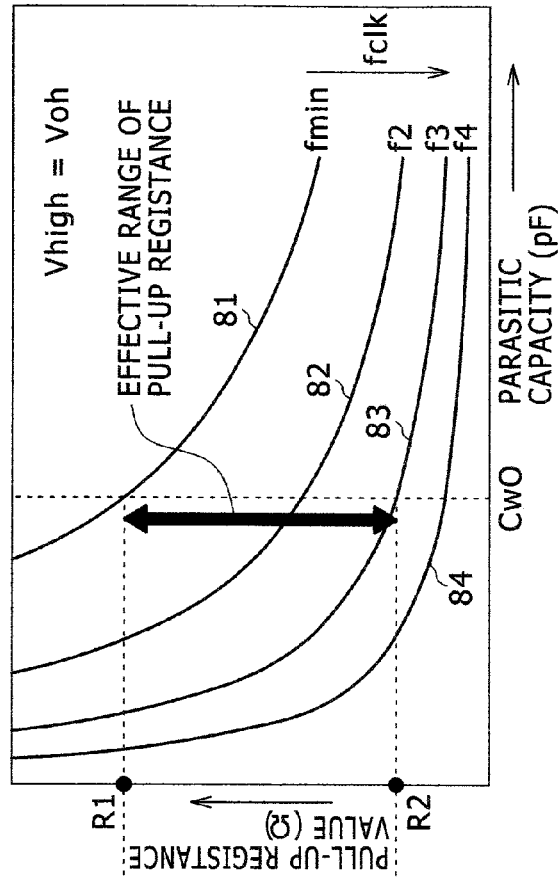
FIGS. 7A and 7B are diagrams illustrating the relationship between the sink current and the pull-up resistance value, and the relationship between the parasitic capacitance and the pull-up resistance value.
Figure 7B:
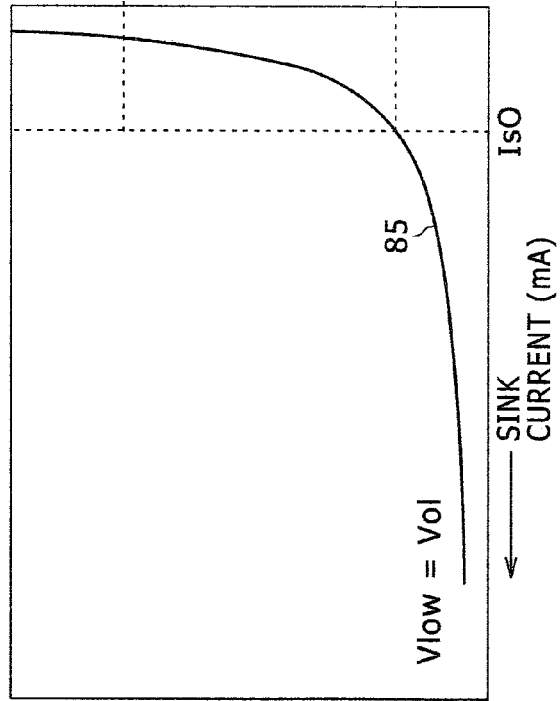
Figure 8:
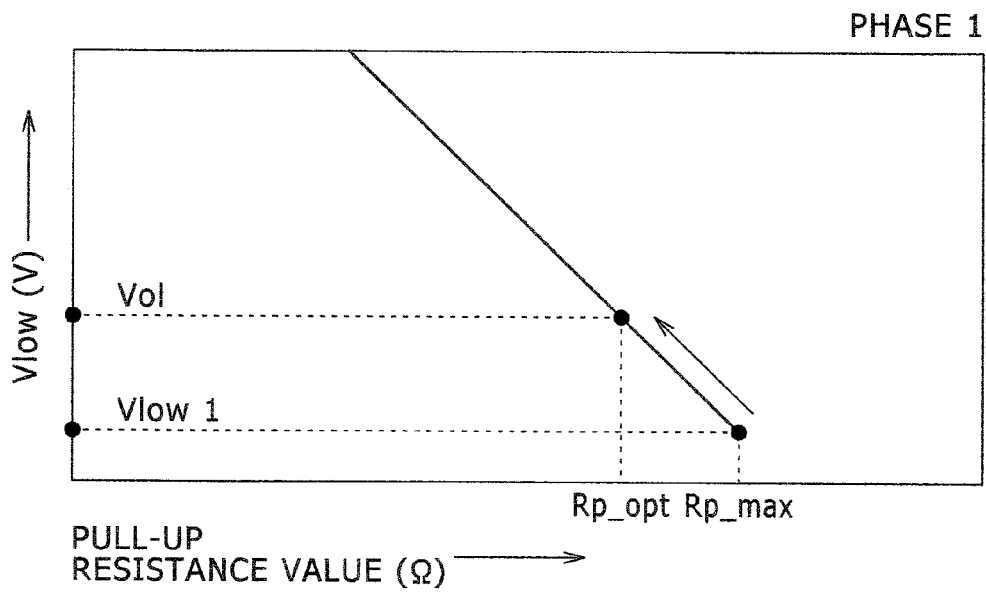
FIG. 8 is a diagram illustrating the relationship between the pull-up resistance value and Vlow.
Figure 9:
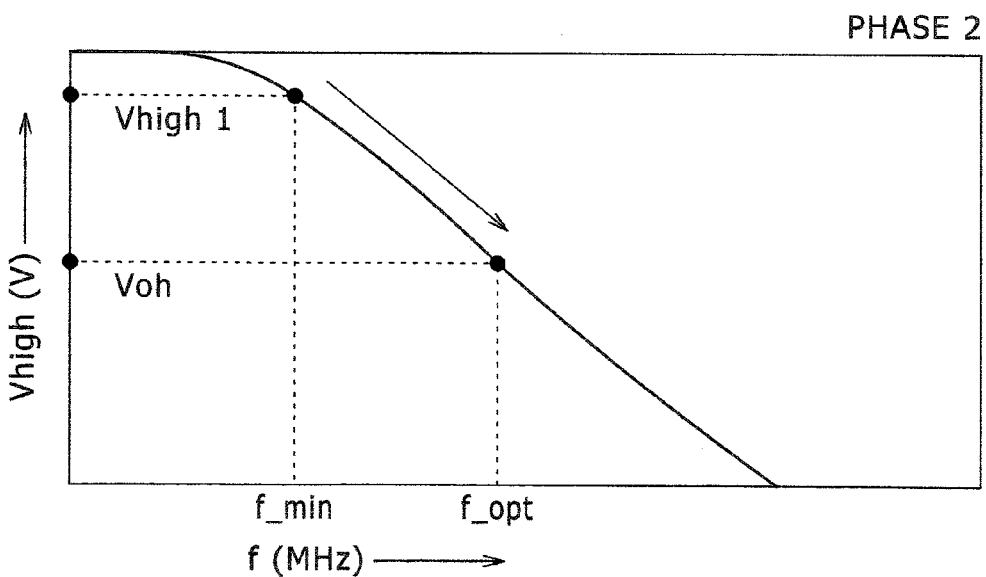
FIG. 9 is a diagram illustrating the relationship between the frequency and Vhigh.

Hereinafter the mode for carrying out the invention will be described using the embodiments with reference to the accompanying drawings. In the following description, substantially like parts are denoted by like reference numerals and their description will not be repeated. Here FIG. 2 is a block diagram of a two-wire bidirectional communication system. FIG. 3 is a block diagram of a calibrator. FIG. 4 is a diagram illustrating an ideal waveform of voltage amplitude of a data signal and clock signal for a two-wire communication system. FIGS. 5 and 6 are diagrams each illustrating the voltage amplitude of the data signal and clock signal for the two-wire communication system. FIGS. 7A and 7B are diagrams illustrating the relationship between the sink current and the pull-up resistance value, and the relationship between the parasitic capacitance and the pull-up resistance value. FIG. 8 is a diagram illustrating the relationship between the pull-up resistance value and Vlow. FIG. 9 is a diagram illustrating the relationship between the frequency and Vhigh. FIGS. 10A and 10B are sequence diagrams each illustrating the data signal and the clock signal during a calibration operation. FIGS. 11A to 11D are flowcharts each illustrating the calibration operation.

In FIG. 2, a two-wire communication system 100 includes N stations (11-1 to 11-N) interconnected by a data line 12 and by a clock line 13, and a calibrator 31. The calibrator 31 is connected to a variable pull-up resistance 15-1 and a variable pull-up resistance 15-2 via control lines 34-1 and 34-2, respectively, within a housing 30. The calibrator 31 is also connected to the data line 12 and the clock line 13 to monitor the data signal and the clock signal. Further the calibrator 31 is connected to a data unit 23-1 of the master station 11-1 via a control line 32. The calibrator 31 is also connected to a clock unit 26-1 of the master station 11-1 via a control line 33.

In the case of inputting no clock signal, the master station 11-1 may not include the amplifier 25-1. Also in the case of outputting no clock signal, the salve stations 11-2 to 11-N may not include field-effect transistors 27-2 to 27-N, respectively.

In FIG. 3, the calibrator includes: a processor 41; a pull-up resistance controller 42 for adjusting the resistance value of the variable pull-up resistance 15-1; an amplifier 47 for monitoring the data signal; a peak detector 43 and a bottom detector 44; a clock control block 46 for controlling the clock frequency of the master station 11-1 by the processor 41; and a data control block 45 for controlling the data. Although the illustration of the clock signal is omitted in FIG. 3, the calibrator monitors the clock line 13 to adjust the variable pull-up resistance 15-2 for the clock signal in the similar way to the data signal.

FIG. 4 shows the case of the data signal in which Vlow is generated due to a voltage drop of the pull-up resistance 15-1 with any of the field-effect transistors 24-1 to 24-N turned ON (conducting state). On the other hand Vhigh is generated as the current hardly flows through the variable pull-up resistance 15-1 with all the field-effect transistors 24-1 to 24-N turned OFF (non-conducting state).

However, when the resistance value of the variable pull-up resistance 15-1 is too small, it is impossible to obtain a sufficient voltage drop even if any of the field-effect transistors 24-1 to 24-N is turned ON, so that the voltage may not drop below Vol which is a desired low level as shown in FIG. 5. In such a case, the calibrator 31 detects a low level of the data signal by the bottom detector 44 and controls the variable pull-up resistance 15-1 to increase above Vol which is the desired low level through the processor 41.

When the pull-up resistance 15-1 is too large, as shown in FIG. 6, Vhigh which is a high level of the data signal may not reach a desired voltage level Voh. This is because the rise time increases as large as the time constant given by the product of the parasitic capacitance 21-1 between the variable pull-up resistance 15-1 and the data line 12. In such a case, the calibrator 31 detects a high level of the data signal by the peak detector 43, and controls the variable pull-up resistance 15-1 to be reduced below Voh which is the desired high level through the processor 41.

Further when the number of ports is large, or when the parasitic capacitance is large because the data line is long or other reason, it is impossible to meet the desired voltage levels Vol and Voh at the same time only by the optimization of the pull-up resistance value as described above. In such a case, the calibrator 31 reduces the clock frequency through the clock control block 46 and adjusts to the clock frequency meeting the desired voltage levels. As a result, optimization of the variable pull-up resistance and clock frequency is performed.

Referring to FIGS. 7A and 7B, a description will be given of the relationship between the sink current and the pull-up resistance value as well as to the relationship between the parasitic capacitance and the pull-up resistance value in the field-effect transistor. Here FIG. 7A is a diagram illustrating the relationship between the sink current and the pull-up resistance value. FIG. 7B is a diagram illustrating the relationship between the parasitic capacitance and the pull-up resistance value.

In FIG. 7A, the graph shows a curve 85 giving Vlow=Vol, where the ordinate is the pull-up resistance value and the abscissa is the sink current. It is shown that Vlow is smaller than Vol in an area above the curve 85, so that it is necessary to set the pull-up resistance value on or above the curve 85.

In FIG. 7B, the graph shows curves 81 to 84 giving Vhigh=Voh, where the ordinate is the pull-up resistance value and the abscissa is the parasitic capacitance, with clock frequencies as parameters. Here fmin is the frequency of the curve 81, f2 is the frequency of the curve 82, f3 is the frequency of the curve 83, and f4 is the frequency of the curve 84. The frequencies have a relationship of fmin<f2<f3<f4. It is shown that Vhigh is larger than Voh in an area above the curves 81 to 84, so that it is necessary to set the pull-up resistance value on or above the curves 81 to 84.

With Is0 for the sink current of the field-effect transistor and Cw0 for the parasitic capacitance of the wiring, the upper limit of the pull-up resistance value is given by R1 from the intersection between Cw0 and the curve 81 of the frequency fmin as shown in FIG. 7B. The lower limit of the pull-up resistance value is given by R2 from the intersection between Is0 and the curve 85 as shown in FIG. 7A. Here R2 is the optimal value of the pull-up resistance giving the applicable maximum frequency f3.

Incidentally, the characteristics of FIGS. 7A, 7B are dependent on the characteristics of the station, the wire length or other factors. When the effective capacitance of the wiring is changed in the event of an update of salve station, the optimal point is different from that estimated before the change. The calibrator 31 shown in FIG. 3 has sufficient intelligence and functionality for calculating the optimal setting of the pull-up resistance value and clock frequency, covering all and any sink currents and effective capacitances.

Now returning to FIG. 2, the two-wire bidirectional communication system 100 can operate in two modes. The first mode is a calibration mode that the block calibrator 31 estimates the optimal values of the pull-up resistance value and clock frequency. The second mode is a normal operation mode for performing communication between the master station 11-1 and the slave stations 11-2 to 11-N by the use of parameters set during the calibration mode with the calibrator kept in an inactive state.

When the calibration mode is invoked, the calibrator 31 controls the data unit 23-1 and clock unit 26-1 of the master station 11-1 to perform a calibration procedure. The calibration mode can be roughly divided into two phases. A calibration phase 1 optimizes the electrical characteristic of Vlow. An object of this phase is to estimate an appropriate pull-up resistance Rp_opt so as to satisfy the required condition Vlow=Vol. The Vlow parameter is strongly dependent on the sink current of the slave stations. Thus the phase 1 of the calibration mode is needed to be performed for each of the slave stations in order to estimate the optimal setting that can be received by all the slave stations within the system.

The system is not calibrated yet and the phase 1 needs to treat each slave station separately. It is necessary to confirm that the treated slave station can interpret the calibration request and can respond as intended. In order to overcome this difficulty, the initial setting of the pull-up resistance is selected to the maximum value the system supports. The restriction to the maximum value of the pull-up resistance Rp is the operation clock frequency that can be set to the minimum frequency.

The concept of the calibration method will be described with reference to FIGS. 8 and 9. It is assumed that the pull-up resistance value of the calibration initial setting is Rp_max and the clock frequency thereof is f_min. This is to allow the master station to perform communication with the slave stations for the first time under the widest range of communication conditions.

The calibration phase 1 will be described with reference to FIG. 8. In FIG. 8, the ordinate is Vlow and the abscissa is the pull-up resistance value. The pull-up resistance controller 42 of FIG. 3 sets the resistance value of the variable pull-up resistance 15-1 to Rp_max. The clock control block 46 controls the clock unit 26-1 of the master station 11-1 to supply a clock of the clock frequency f_min to the slave station. The data control block 45 controls the data unit 23-1 of the master station 11-1 to instruct the station 11-M (M: 1 to N) to send a calibration signal. The station 11-M sends a series of alternating logic high and logic low. During the signal transmission, the bottom detector 44 of the calibrator 31 monitors the data line 12 and determines Vlow1.

The resistance value of the variable pull-up resistance 15-1 is reduced to obtain Vlow2. Then Rp_opt satisfying the required condition Vlow=Vol is obtained using a step by step method, binary search, or a linear approximation method.

In order to ensure that the setting of Rp_opt can be received by all the stations existing on a bus, the calibration phase 1 repeats the procedure for all the slave stations. A more appropriate method is to selectively perform the calibration phase 1 only for the slave station that has never been calibrated before.

Next a calibration phase 2 will be described with reference to FIG. 9. It is assumed that Rp opt was obtained in the calibration phase 1 to serve as the resistance value of the variable pull-up resistance 15-1 that can be communicated with all the slave stations. The pull-up resistance controller 42 sets the resistance value of the variable pull-up resistance 15-1 to Rp_opt. In the calibration phase 2, none of the slave stations 11-2 to 11-N responds during this phase, keeping their transistors in OFF state. The initial clock frequency setting is f_min in the calibration phase 2. During this phase, the master station 11-1 sends a series of alternating logic high and logic low. During the signal transmission, the peak detector 43 determines Vhigh1 by monitoring the data line.

The clock frequency is increased and is converged to an optimal point on a curve L12 satisfying the required condition Vhigh=Voh by several repeat methods. The optimal clock frequency f_opt can be calculated from the optimal point. The curve of FIG. 9 can be approximated to $Vhigh=A \cdot (1-\exp(-B/f))$ due to the nature of the capacitance charge of Vhigh. Here A and B are the constants, f and Vhigh are the x coordinate and y coordinate indicated in FIG. 9. It is possible to design a faster convergence method by taking into consideration the above equation.

The change of the clock frequency setting obtained in the phase 2 is achieved using the clock control block 46 connected to the clock unit 26-1 of the master station 11-1. The processor 41 uses the data control block 45 to operate the data unit 23-1 of the master station 11-1 during the calibration procedure. Once the two phases of the calibration have been successfully completed, the system can be operated within the required electrical specifications Voh and Vol at the fastest possible clock frequency.

Next calibration protocols for each of the calibration phases will be described with reference to FIGS. 10A and 10B. Here FIG. 10A shows calibration protocols for the calibration phase 1. FIG. 10B shows calibration protocols for the calibration phase 2.

In FIG. 10A, a data signal 50 is shown in an upper part and a clock signal 60 is shown in a lower part. The clock signal 60 is sent by the master station 11-1. The data signal 50 is sent by the master station 11-1 and by the station 11-M accordingly, so that each corresponding source is described in a source column.

When entering the calibration phase 1, the master station 11-1 sends START condition 51 and STATION ADDRESS 52. At this time the frequency of the clock signal is fmin. The station 11-M corresponding to STATION ADDRESS 52 sends ACK 53. The master station 11-1 receives ACK 53 and sends CAL MODE CONTROL BYTE 1 54. The station 11-M receives CAL MODE CONTROL BYTE 1 54 and sends an alternating bit sequence of 10101010 55. It is to be noted that the station 11-M includes the master station. During the signal transmission, the calibrator 31 measurers Vlow. The master station 11-1 sends ACK 56 and STOP 57 to continue the measurement with the pull-up resistance changed.

In FIG. 10B, a data signal 70 is shown in an upper part and a clock signal 90 is shown in a lower part. The clock signal 90 is sent by the master station 11-1. The data signal 70 is sent by the master station 11-1 and by the slave stations 11-2 to 11-N accordingly, so that each corresponding source is described in a source column.

When entering the calibration phase 2, the master station 11-1 sends START condition 71 and GENERAL CALL ADDRESS 72. At this time the frequency of the clock signal is fmin. The slave stations 11-2 to 11-N send ACK 73. The master station 11-1 receives ACK 73 and sends CAL MODE CONTROL BYTE 2 74. The slave stations 11-2 to 11-N receive CAL MODE CONTROL BYTE 2 74 but do not respond thereto. The master station 11-1 sends an alternating bit sequence of 10101010 75. During the signal transmission, the calibrator 31 measures Vhigh. The master station 11-1 sends ACK 76 and STOP 77 to continue the measurement with the clock frequency changed. Incidentally, in the second and subsequent operations, the clock frequency is increased after the transmission of 10101010 75.

Referring to FIGS. 11A to 11D, a description will be given of the operation that the two-wire bidirectional communication system 100, which is operating in the normal operation mode, passes through the calibration mode and then returns to the normal operation mode.

Figure 11A:
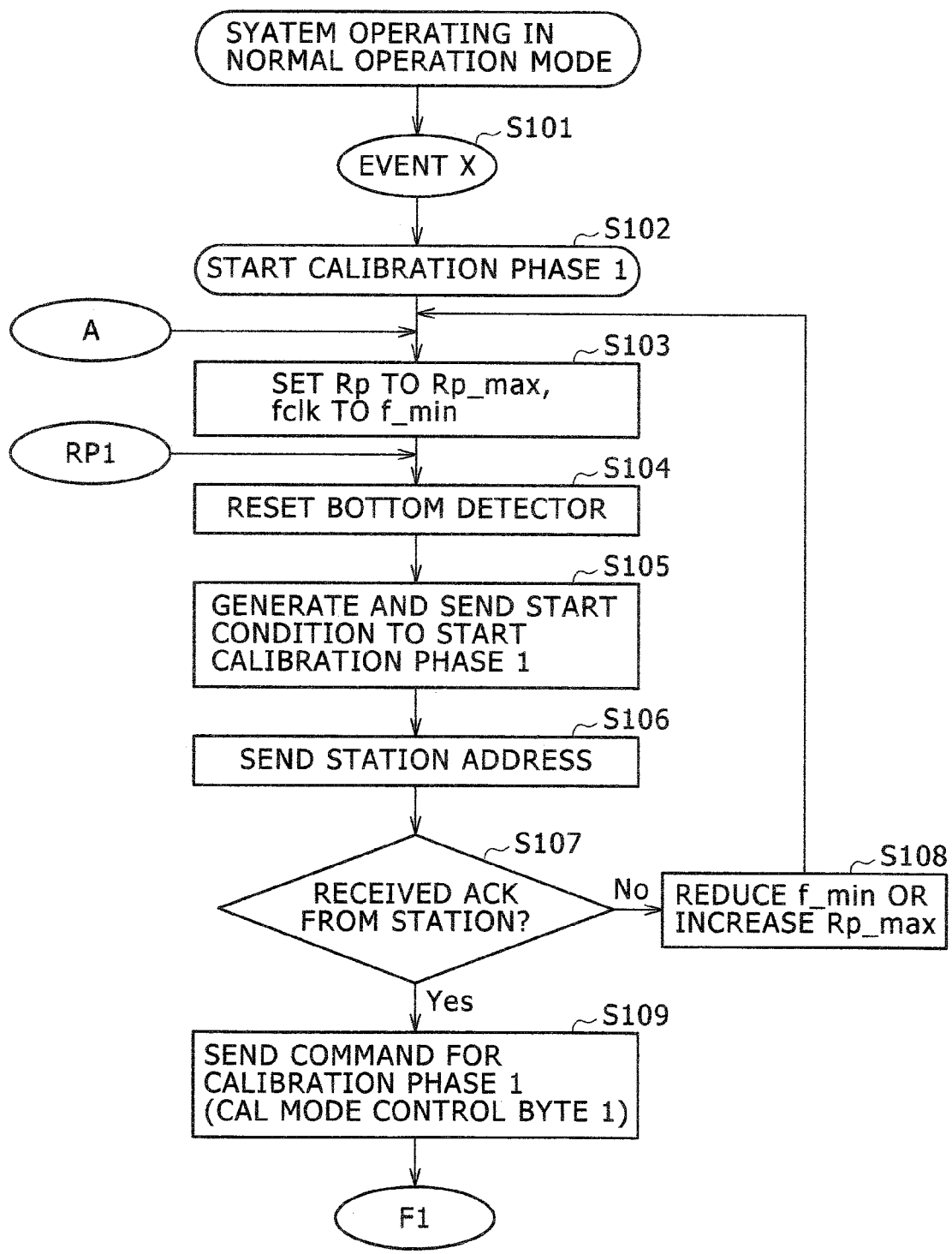
FIG. 11A is a flowchart (No. 1) illustrating the calibration operation.

In FIG. 11A, it is assumed that an event X occurs during the operation performed in the normal operation mode (S101). The event X includes a reset, introduction of a new slave station, a change of the wire length, or a calibration request of a user. The calibration phase 1 is started after S101 (S102). The calibrator 31 sets the pull-up resistance value to Rp_max and the clock frequency to f_min (S103). Then the calibrator 31 resets the bottom detector 44 (S104). During the calibration mode, the calibrator 31 controls the master station. The master station generates and sends START condition to start the calibration phase 1 (S105). Following this the master station sends the station address of a station involved in the calibration (S106), and waits for receiving ACK (S107). When there is no ACK received from the slave station within a predetermined time period in S107 (NO), this is because the slave station cannot interpret the signal. In this case, the calibrator may need to redefine Rp_max and fmin, confirming the availability of communication with the slave station by reducing f_min or by increasing Rp_max. Thus the process returns to S103 through S108. On the other hand, when receiving ACK from the slave station in S107 (YES), the master station sends a command (CAL CONTROL BYTE 1) for the calibration phase 1 to instruct the corresponding station that the calibrator attempts to perform the calibration phase 1 (S109).

Figure 11B:
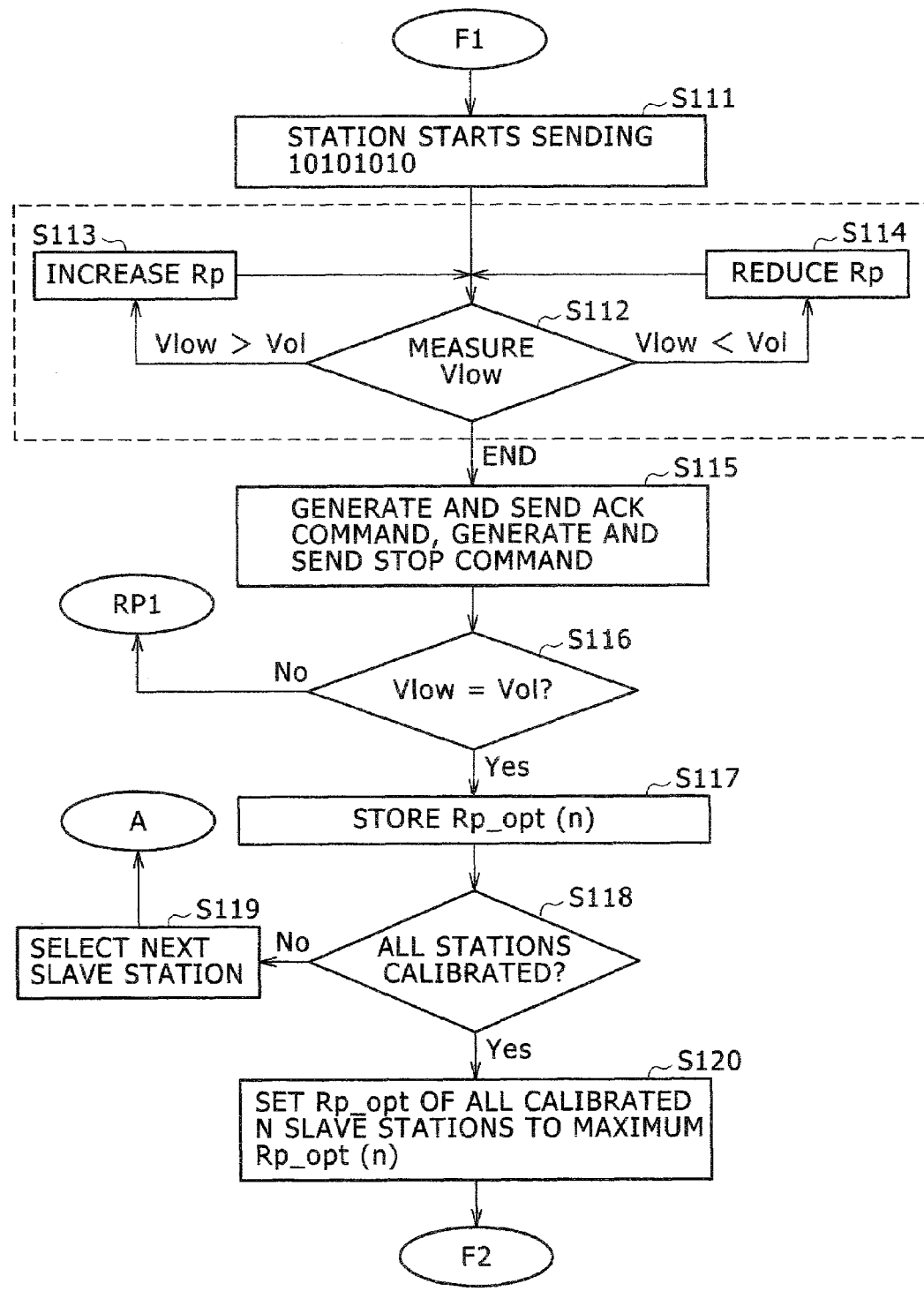
FIG. 11B is a flowchart (No. 2) illustrating the calibration operation.

In FIG. 11B, the station starts sending 10101010 in response to the received command for the calibration phase 1 (S111). The calibrator measures Vlow (S112). When the measured Vlow is larger than Vol, the calibrator increases Rp in S113, and when the measured Vlow is smaller than Vol, the calibrator reduces Rp in S114. Then the calibrator measures Vlow again (S112). Upon completion of the measurement in S112, the master station generates and sends an ACK command, and then generates and sends a STOP command (S115). Next it is determined whether Vlow is equal to Vol within a predetermined error range (S116), and if it is not equal, the process returns to S104.

When it is equal in S116, the calibrator stores Rp_opt (n) (S117). The calibrator determines whether all the stations are calibrated (S118). If not all the stations are calibrated (NO), the calibrator selects the next station (S119). Then the process returns to S103. When YES in S119, the calibrator sets Rp_opt of all the calibrated n slave stations to the maximum Rp_opt (n) (S120). Then the process moves to S131.

Figure 11C:
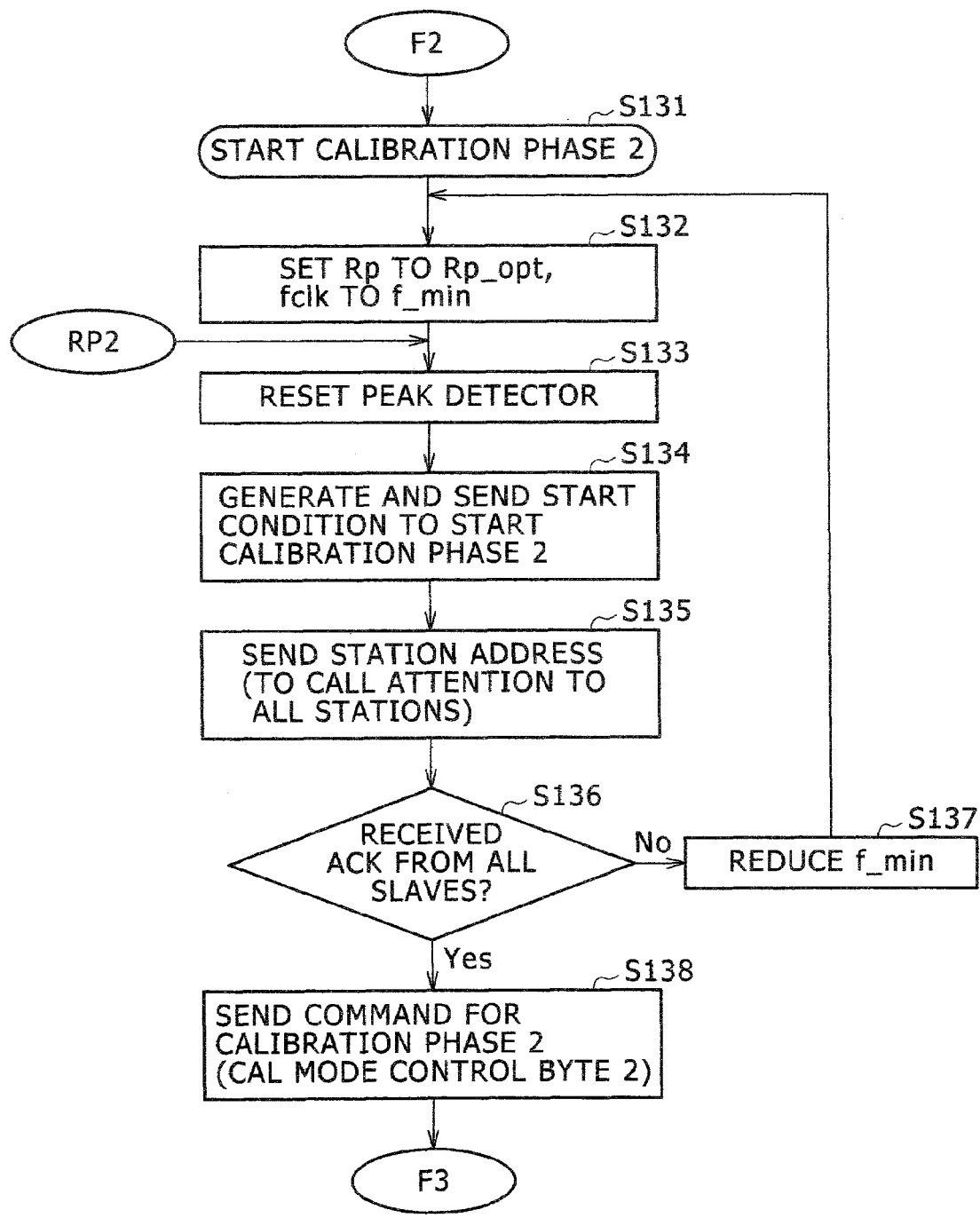
FIG. 11C is a flowchart (No. 3) illustrating the calibration operation.

In FIG. 11C, when the calibration phase 2 is started (S131), the variable calibrator first sets the resistance value of the pull-up resistance (Rp) to Rp_opt and the clock frequency (fclk) to f_min (S132). The calibrator resets the peak detector (S133), and generates and sends START condition to start the calibration phase 2 (S134). Under the control of the calibrator, the master station sends GENERAL CALL ADDRESS (S135) to determine whether to receive ACK from all the slave stations (S136). If it is failed to receive ACK from all the slave stations within a predetermine time period in S136 (NO), the calibrator reduces f_min (S137). Then the process returns to S132. When YES in S136, the master station sends a command (CAL MODE CONTROL BYTE 2) for the calibration phase 2 (S138).

Figure 11D:
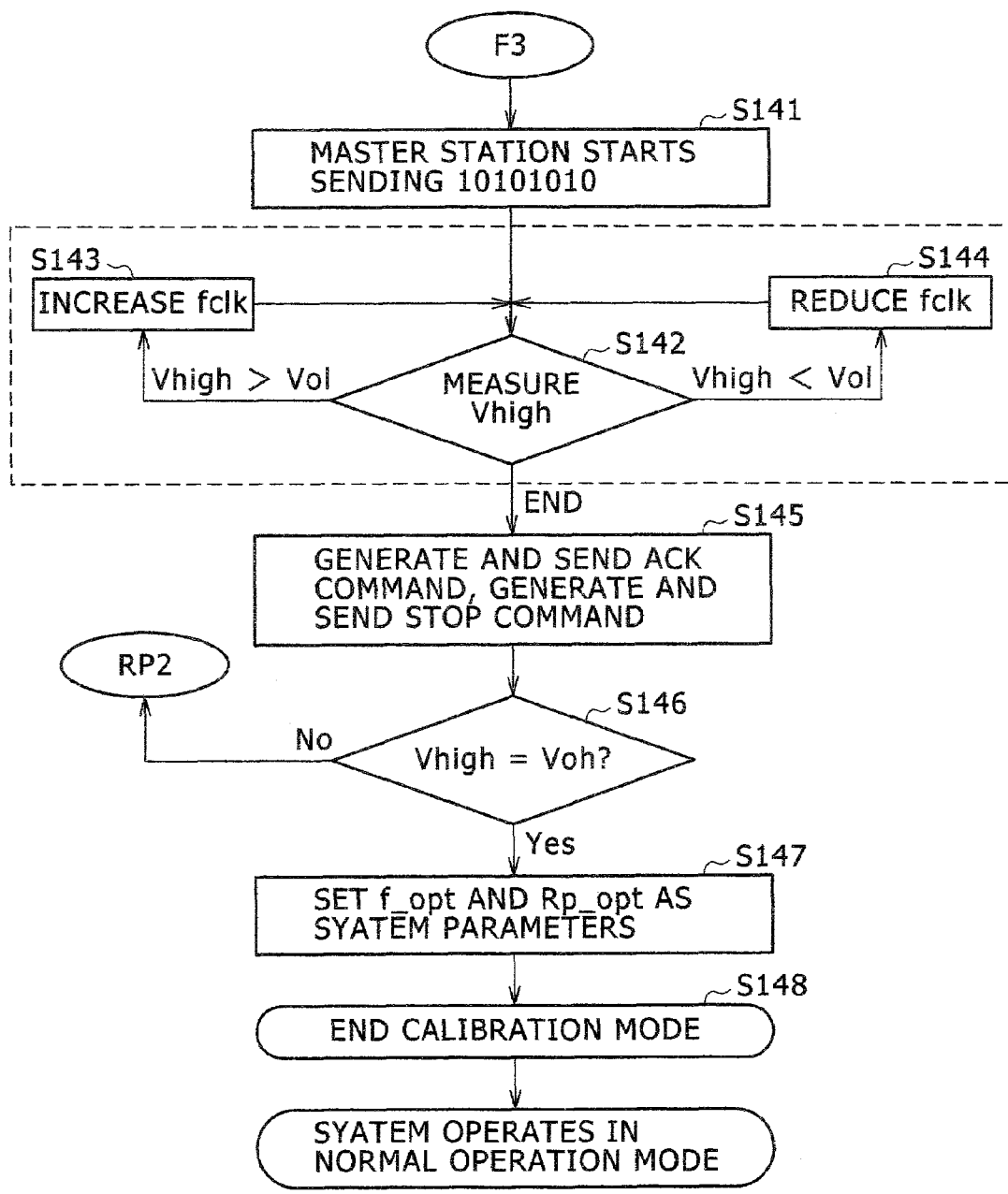
FIG. 11D is a flowchart (No. 4) illustrating the calibration operation.

In FIG. 11D, all the slave stations turn their field-effect transistors to OFF state in response to the received command for the calibration phase 2. The master station starts sending 10101010 (S141), and then the calibrator measures Vhigh. The calibrator increases fclk if Vhigh>Voh(S143), while reducing fclk if Vhigh<Voh (S144). Then the calibrator measures Vhigh again (S142). When the measurement is completed in S142, the master station generates and sends an ACK command, then generates and sends a STOP command (S145). Next it is determined whether Vhigh is equal to Voh within a predetermined error range (S146), and if it is not equal (NO), the process returns to S133.

When it is equal in S146, the calibrator sets f_opt and Rp_opt as system parameters (S147). In this way the calibration mode is completed (S148), and the system operates in the normal operation mode.

After completion of the calibration mode, the calibrator stops to control the master station and the system returns to the normal operation mode. The foregoing discussion of the calibration method has mainly focused on the data signal. The calibration of the clock line is not necessary for a system on which a single master is mounted where the clock output from the master station is a push-pull type. In a system with plural master stations mounted thereon, the clock output is an open drain output, and the electrical characteristic of the clock signal can be optimized by adopting the concept of the calibration method similar to that proposed in FIGS. 8 and 9. Incidentally, of the clock frequencies obtained from the data line calibration and the clock line calibration, the slower is finally selected for the clock frequency.

The above description of the calibration procedure uses specific terms in order to better understand how the calibration mode can be performed by slightly changing the existing two-wire communication protocols. However, it will be apparent to those skilled in the art that specific details are not necessary and that any other protocols can be used. Having described the invention with reference to certain preferred embodiments, those skilled in the art will understand that changes can be made within the scope of the preferred embodiments. It is to be understood that the mode and details can be modified in various ways without departing from the sprit and scope of the preferred embodiments.

According to the present invention, it is possible to obtain a two-wire bidirectional communication system and a calibrator that are able to provide the fastest communication speed between a master station and slave stations.

We claim:

1. A calibrator connected to a clock supply station, comprising:
   a processor; and
   a clock control block and a peak detector connected to the processor,
   wherein said processor controls said clock control block according to a peak voltage detected by said peak detector, and controls a clock frequency supplied by said clock supply station.

2. The calibrator according to claim 1,
   wherein said processor controls said clock control block so that said peak voltage is a target peak voltage.

* * * * *